(12) United States Patent
Sekijima

(10) Patent No.: US 12,406,953 B2
(45) Date of Patent: Sep. 2, 2025

(54) SEMICONDUCTOR APPARATUS AND METHOD OF MAKING SEMICONDUCTOR APPARATUS

(71) Applicant: SHINKO ELECTRIC INDUSTRIES CO., LTD., Nagano (JP)

(72) Inventor: Shinichiro Sekijima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/805,302

(22) Filed: Jun. 3, 2022

(65) Prior Publication Data

US 2022/0399293 A1 Dec. 15, 2022

(30) Foreign Application Priority Data

Jun. 10, 2021 (JP) .................................. 2021-097292

(51) Int. Cl.
*H01L 23/00* (2006.01)
(52) U.S. Cl.
CPC .............. *H01L 24/06* (2013.01); *H01L 24/09* (2013.01); *H01L 24/17* (2013.01);
(Continued)
(58) Field of Classification Search
CPC ......... H01L 24/06; H01L 24/09; H01L 24/16; H01L 24/81; H01L 24/07; H01L 24/11;
(Continued)

(56) References Cited

U.S. PATENT DOCUMENTS 5,926,694 A * 7/1999 Chigawa ................. H01L 24/83
257/E21.503
6,208,525 B1 * 3/2001 Imasu ..................... H05K 1/111
361/795

(Continued)

FOREIGN PATENT DOCUMENTS

JP 2012-009782 1/2012
WO 2007/069606 6/2007

OTHER PUBLICATIONS

Office Action mailed on Dec. 3, 2024 with respect to the corresponding Japanese patent application No. 2021-097292.

*Primary Examiner* — Julio J Maldonado
*Assistant Examiner* — Eric Manuel Mulero Flores
(74) *Attorney, Agent, or Firm* — IPUSA, PLLC

(57) ABSTRACT

A semiconductor apparatus includes a first substrate having a first surface and a first conductive pad on the first surface, a second substrate having a second surface opposing the first surface, and having a second conductive pad on the second surface, a semiconductor device disposed between the first substrate and the second substrate and mounted on the first surface of the first substrate, and a conductive core ball in contact with the first conductive pad and the second conductive pad, wherein a maximum dimension of the conductive core ball in a first direction perpendicular to the first surface is smaller than a maximum diameter of the conductive core ball in a plane parallel to the first surface, and wherein the conductive core ball includes a first contact surface in direct contact with the first conductive pad, and a second contact surface in direct contact with the second conductive pad.

6 Claims, 11 Drawing Sheets

(52) U.S. Cl.
CPC ............... *H01L 2224/05147* (2013.01); *H01L 2924/01029* (2013.01); *H01L 2924/014* (2013.01)

(58) Field of Classification Search
CPC ............... H01L 24/15; H01L 23/49816; H01L 23/49827; H01L 23/49833; H01L 23/49822; H01L 23/12; H01L 23/49838; H01L 2224/13147; H01L 2224/13562; H01L 2224/16057; H01L 2224/81091; H01L 2224/05147; H01L 21/52; H01L 2924/01029; H01L 2924/014; H01L 2224/13001–13499; H01L 24/10–17; H01L 2224/1301–13019; H01L 2224/1302–13028; H01L 2224/13075–13084; H01L 23/488–49894; H01L 2224/10–17519; H01L 21/24–248; H01L 21/40; H01L 2224/1354–13999; H01L 2224/165–16507; H01L 2224/09051–09055; H01L 2224/08052–0807; H01L 2224/06051; H01L 25/10–13; H01L 2225/10–1094; H01L 2224/80201; H01L 2224/80203; H01L 2224/80207; H01L 2224/81201; H01L 2224/81203; H01L 2224/81207; H01L 2224/0401; H01L 2224/0501–05011; H01L 2224/0555; H01L 2224/0605; H01L 2224/07; H01L 2224/0805; H01L 2224/0905; H01L 2224/1356–13565

See application file for complete search history.

(56) References Cited

U.S. PATENT DOCUMENTS

| | | |
|---|---|---|
| 10,157,850 B1* | 12/2018 | Wu .................... H01L 23/5386 |
| 2003/0119299 A1* | 6/2003 | Jiang ...................... H01L 24/16 |
| | | 257/E21.511 |
| 2008/0142968 A1* | 6/2008 | Jadhav ................... H01L 24/13 |
| | | 257/E23.021 |
| 2009/0008765 A1* | 1/2009 | Yamano ................. H01L 25/162 |
| | | 257/E23.125 |
| 2011/0256662 A1 | 10/2011 | Yamano et al. |
| 2011/0318878 A1 | 12/2011 | Tanaka |
| 2012/0146244 A1* | 6/2012 | Dohi ..................... H01L 25/105 |
| | | 257/E23.141 |
| 2013/0043573 A1* | 2/2013 | Williams .......... H01L 23/49572 |
| | | 257/676 |
| 2015/0228571 A1* | 8/2015 | Shiraki .................. H01L 24/97 |
| | | 257/701 |

\* cited by examiner

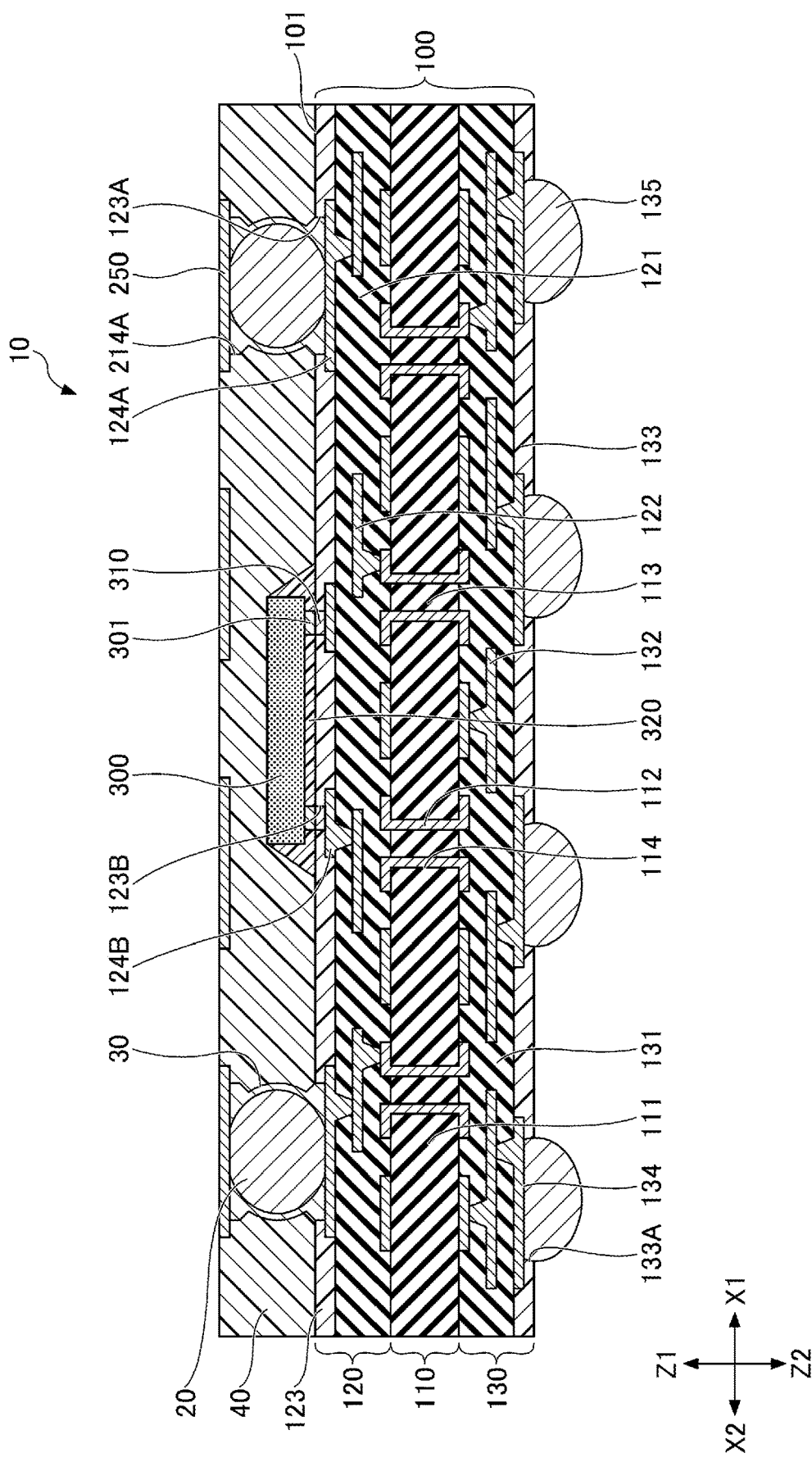

SEMICONDUCTOR APPARATUS AND METHOD OF MAKING SEMICONDUCTOR APPARATUS

CROSS-REFERENCE TO RELATED APPLICATIONS

The present application is based upon and claims the benefit of priority from the prior Japanese Patent Application No. 2021-097292 filed on Jun. 10, 2021, with the Japanese Patent Office, the entire contents of which are incorporated herein by reference.

FIELD

The disclosures herein relate to semiconductor apparatuses and methods of making a semiconductor apparatus.

BACKGROUND

Some semiconductor packages are configured such that an upper substrate and a lower substrate are connected to each other via copper core balls serving as spacers (Patent Document 1).

The semiconductor package disclosed in Patent Document 1 achieves intended purposes. Nonetheless, higher reliability is desired with respect to connection between the copper core balls and the lower and upper substrates.

It may be an object of the present disclosures to provide a semiconductor apparatus and a method of making the semiconductor apparatus for which connection reliability is improved.

RELATED-ART DOCUMENTS

Patent Document

[Patent Document 1] Japanese Laid-open Patent Publication No. 2012-9782

SUMMARY

According to an aspect of the embodiment, a semiconductor apparatus includes a first substrate having a first major surface and a first conductive pad on the first major surface, a second substrate having a second major surface opposing the first major surface, and having a second conductive pad on the second major surface, a semiconductor device disposed between the first substrate and the second substrate and mounted on the first major surface of the first substrate, and a conductive core ball in contact with the first conductive pad and the second conductive pad, wherein a maximum dimension of the conductive core ball in a first direction perpendicular to the first major surface is smaller than a maximum diameter of the conductive core ball in a plane parallel to the first major surface, and wherein the conductive core ball includes a first contact surface in direct contact with the first conductive pad, and a second contact surface in direct contact with the second conductive pad.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 11 is a cross-sectional view illustrating an alternative embodiment of a semiconductor apparatus.

DESCRIPTION OF EMBODIMENTS

In the following, the embodiment will be described with reference to the accompanying drawings. In the specification and drawings, elements having substantially the same functions or configurations are referred to by the same numerals, and a duplicate description thereof may be omitted. In the present disclosures, the X1-X2 direction, the Y1-Y2 direction, and the Z1-Z2 direction are orthogonal to each other. A plane that includes the X1-X2 direction and the Y1-Y2 direction is referred to as an XY plane. A plane that includes the Y1-Y2 direction and the Z1-Z2 direction is referred to as a YZ plane. A plane that includes the Z1-Z2 direction and the X1-X2 direction is referred to as a ZX plane. For the sake of convenience, the Z1-Z2 direction is referred to as a vertical direction. Also, the Z1 side is referred to as an upper side, and the Z2 side is referred to as a lower side. A "plan view" refers to a view of an object as taken from the Z1 side. A "plane shape" refers to the shape of an object as appears when viewed from the Z1 side. It may be noted, however, that a semiconductor apparatus may be used in an upside-down position, or may be placed at any angle.

Figure 1:
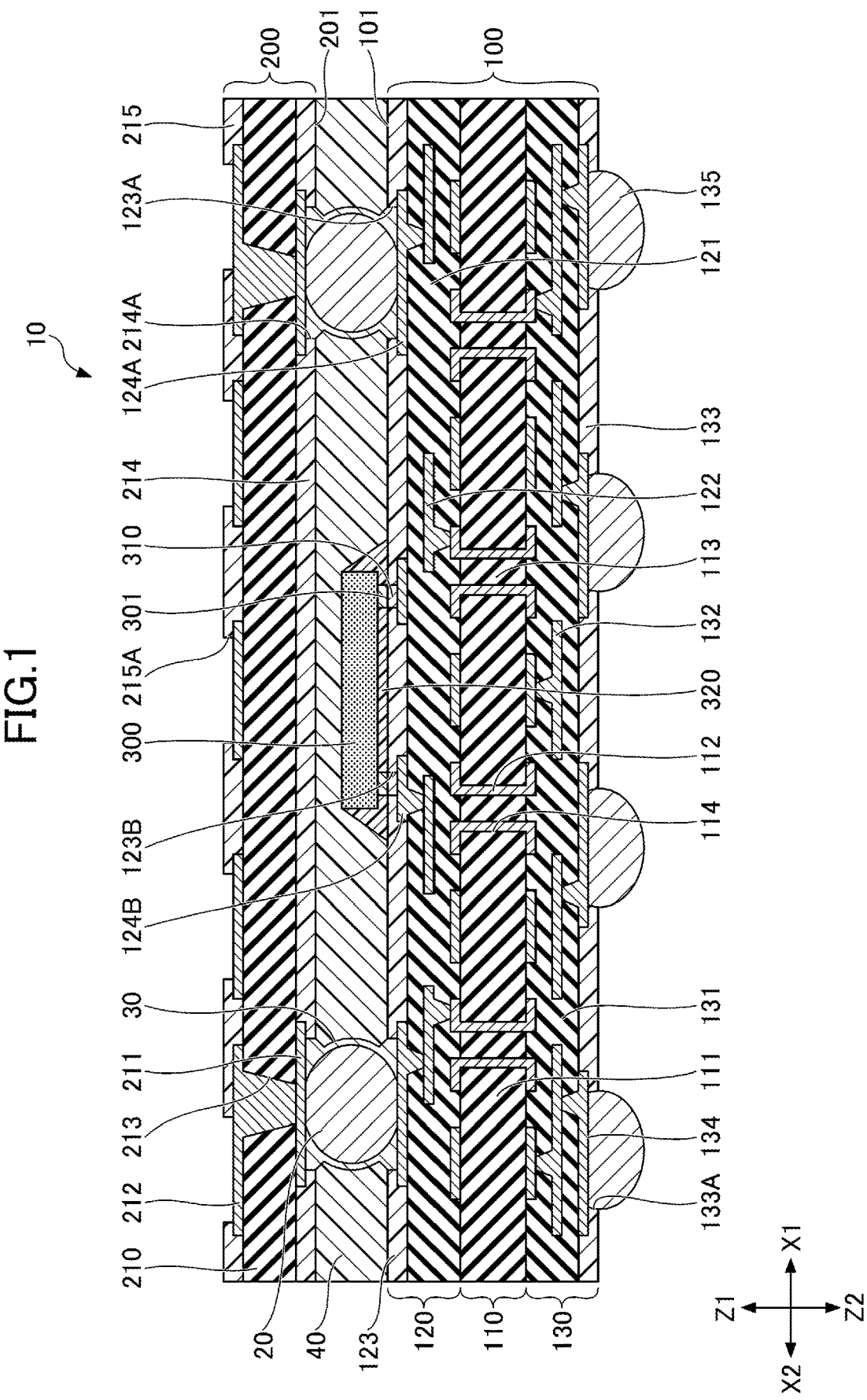
FIG. 1 is a cross-sectional view illustrating a semiconductor apparatus according to an embodiment.

The present embodiment relates to a semiconductor apparatus and a method of making the same. FIG. 1 is a cross-sectional view illustrating an example of a semiconductor apparatus according to the embodiment;

The semiconductor apparatus 10 according to the embodiment includes a lower substrate 100, an upper substrate 200, and a semiconductor device 300. The lower substrate 100 has am upper surface 101 substantially parallel to an XY plane, and the upper substrate 200 has a lower surface 201 substantially parallel to an XY plane. The upper substrate 200 is disposed on the upper side (Z1 side) of the lower substrate 100. The lower surface 201 of the upper substrate 200 faces the upper surface 101 of the lower substrate 100. The lower substrate 100 is an example of a first substrate, and the upper substrate 200 is an example of a second substrate. The upper surface 101 of the lower substrate 100 is an example of a first major surface, and the lower surface 201 of the upper substrate 200 is an example of a second major surface.

The lower substrate 100 includes, for example, a core layer 110, a build-up layer 120 provided on the upper surface of the core layer 110, and a build-up layer 130 provided on the lower surface of the core layer 110. The lower substrate 100 may be a core-less substrate that does not include a core layer.

The core layer 110 includes an insulating substrate 111 with through-holes 114 formed therethrough, conductive through-vias 112 formed on the inner wall surface of the through-holes 114, and a filler material 113 filling the inside of the conductive through-vias 112. The material of the core layer 110 may be glass epoxy or the like, and the material of conductive through-vias 112 may be copper or the like, for example.

The build-up layer 120 includes insulating layers 121, interconnect layers 122, and a solder resist layer 123. The solder resist layer 123 has openings 123A for connection to the upper substrate 200 and openings 123B for mounting the semiconductor device 300. The interconnect layers 122 includes, on the uppermost surface of the insulating layers 121, conductive pads 124A for connection to the upper substrate 200 and conductive pads 124B for mounting the semiconductor device 300. The conductive pads 124A are exposed in the openings 123A and the conductive pads 124B are exposed in the openings 123B. An example of the material of the interconnect layers 122 is a conductor such as copper. The conductive pads 124A are an example of first conductive pads.

The build-up layer 130 includes insulating layers 131, interconnect layers 132, and a solder resist layer 133. The solder resist layer 133 has openings 133A for external connection. The interconnect layers 132 include conductive pads 134 on the lowermost surface of the insulating layers 131. The conductive pads 134 are exposed in the openings 133A. An example of the material of the interconnect layers 132 is a conductor such as copper. Solder balls 135 are provided on the conductive pads 134.

The conductive pads 124A, the conductive pads 124B, and the conductive pads 134 are electrically connected via the interconnect layers 122, the conductive through-vias 112, and the interconnect layers 132. The number of insulating layers 121 and interconnect layers 122 included in the build-up layer 120 and the number of insulating layers 131 and interconnect layers 132 included in the build-up layer 130 are not limited to particular numbers.

The semiconductor device 300 is flip-chip mounted on the upper surface 101 of the lower substrate 100. In other words, the bumps 301 of the semiconductor device 300 are electrically connected to the conductive pads 124B of the lower substrate 100 via bonding material 310. The bonding material 310 is made of a solder, for example. An underfill material 320 fills the gap between the semiconductor device 300 and the lower substrate 100.

The upper substrate 200 includes, for example, a core layer 210, conductive pads 211, conductive pads 212, a solder resist layer 214, and a solder resist layer 215.

The conductive pads 211 are provided on the lower surface of the core layer 210, and the conductive pads 212 are provided on the upper surface of the core layer 210. The conductive pads 212 are connected to the conductive pads 211 through via holes 213 formed through the core layer 210. An example of the material of the conductive pads 211 and the conductive pads 212 is a conductor such as copper. The conductive pads 211 are an example of second conductive pads.

The solder resist layer 214 covers the lower surface of the core layer 210. The solder resist layer 214 has openings 214A for connection to the lower substrate 100. The conductive pads 211 are exposed in the openings 214A. The solder resist layer 215 covers the upper surface of the core layer 210. The solder resist layer 215 has openings 215A for external connection. The conductive pads 212 are exposed in the openings 215A. The conductive pads 212 are used to mount electronic components such as semiconductor devices, passive devices, or other interconnect substrates to the upper substrate 200.

Figure 2:
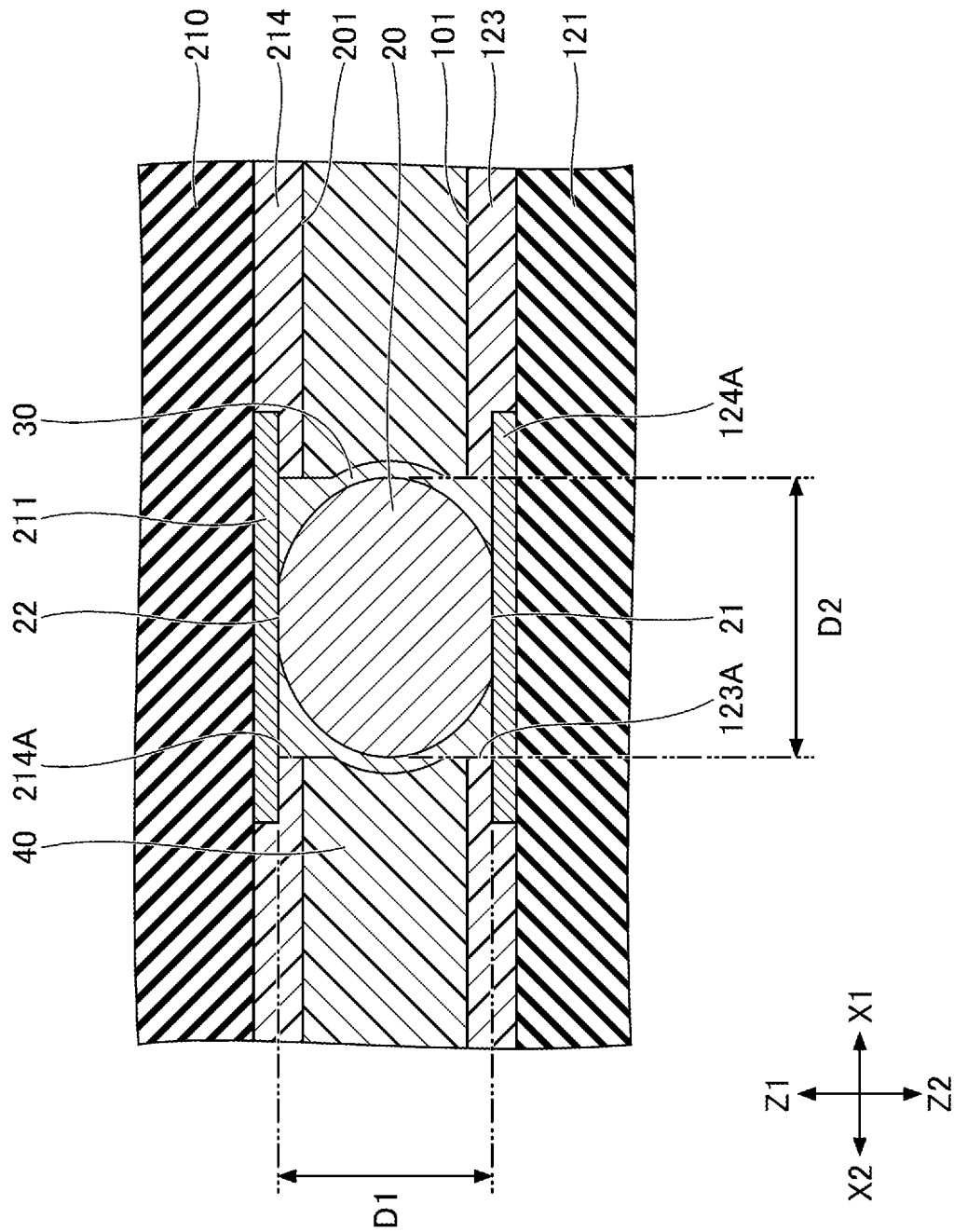
FIG. 2 is a cross-sectional view illustrating a copper core ball according to the embodiment.

The semiconductor apparatus 10 has copper (Cu) core balls 20 in contact with the conductive pads 124A of the lower substrate 100 and the conductive pads 211 of the upper substrate 200. The copper core balls 20 will be described below. FIG. 2 is a cross-sectional view illustrating one of the copper core balls 20.

The conductive pad 124A of the lower substrate 100 and the conductive pad 211 of the upper substrate 200 are arranged in opposing relationship. The copper core ball 20 is in contact with both the conductive pad 124A and the conductive pad 211. The copper core ball 20 has a first contact surface 21 in direct contact with the conductive pad 124A and a second contact surface 22 in direct contact with the conductive pad 211. The copper core ball 20 has a maximum dimension D1 in the first direction perpendicular to the upper surface 101 of the lower substrate 100, i.e., the Z1-Z2 direction, and maximum diameter D2 in a plane parallel to the upper surface 101, i.e., parallel to an XY plane, and the maximum dimension D1 is smaller than the maximum diameter D2. The maximum dimension D1 is the extent of the copper core ball 20 in the Z1-Z2 direction at the position at which the extent becomes the maximum. The maximum dimension D1 is essentially the height of the copper core ball 20. The maximum diameter D2 is the diameter of the copper core ball 20 in an XY plane at the position at which the diameter becomes the maximum. The maximum dimension D1 is about 90% of the maximum diameter D2, for example. An Ni layer may be formed on the surface of the copper core ball 20.

The shape of the copper core ball 20 may be ellipsoidal. The term "ellipsoidal" in this disclosure does not refer to a mathematically defined perfect ellipsoid. When the copper core ball 20 is ellipsoidal, the maximum dimension D1 corresponds to the short diameter of the ellipsoid, and the maximum diameter D2 corresponds to the long diameter of the ellipsoid. The first contact surface 21 and the second contact surface 22 may be flat surfaces, or may be convex surfaces bulging at the horizontal center of the copper core ball 20.

The plane shape of the first contact surface 21 and the second contact surface 22 is circular. The first diameter of the first contact surface 21 and the second diameter of the second contact surface 22 are approximately 10% of the maximum diameter D2. The first area of the first contact surface 21 and the second area of the second contact surface 22 are approximately 1% of the cross-sectional area of the copper core ball 20 taken along an XY plane at the position at which the cross-sectional area becomes the maximum.

A solder layer 30 covers the side surface of the copper core ball 20. The solder layer 30 may be in contact with both the conductive pad 124A and the conductive pad 211. The material of the solder layer 30 is, for example, a Pb (lead) free solder that is based on Sn, Sn—Ag, Sn—Cu, or Sn—Ag—Cu.

A mold resin 40 fills the gap between the upper substrate 200 and the lower substrate 100, so that the upper substrate 200 is secured to the lower substrate 100. The distance between the upper substrate 200 and the lower substrate 100 is maintained by the copper core ball 20.

In the following, a description will be given of a method of making the semiconductor apparatus 10 according to the embodiment. FIG. 3 through FIG. 8 are cross-sectional views illustrating the method of making the semiconductor apparatus 10 according to the embodiment.

Figure 3:
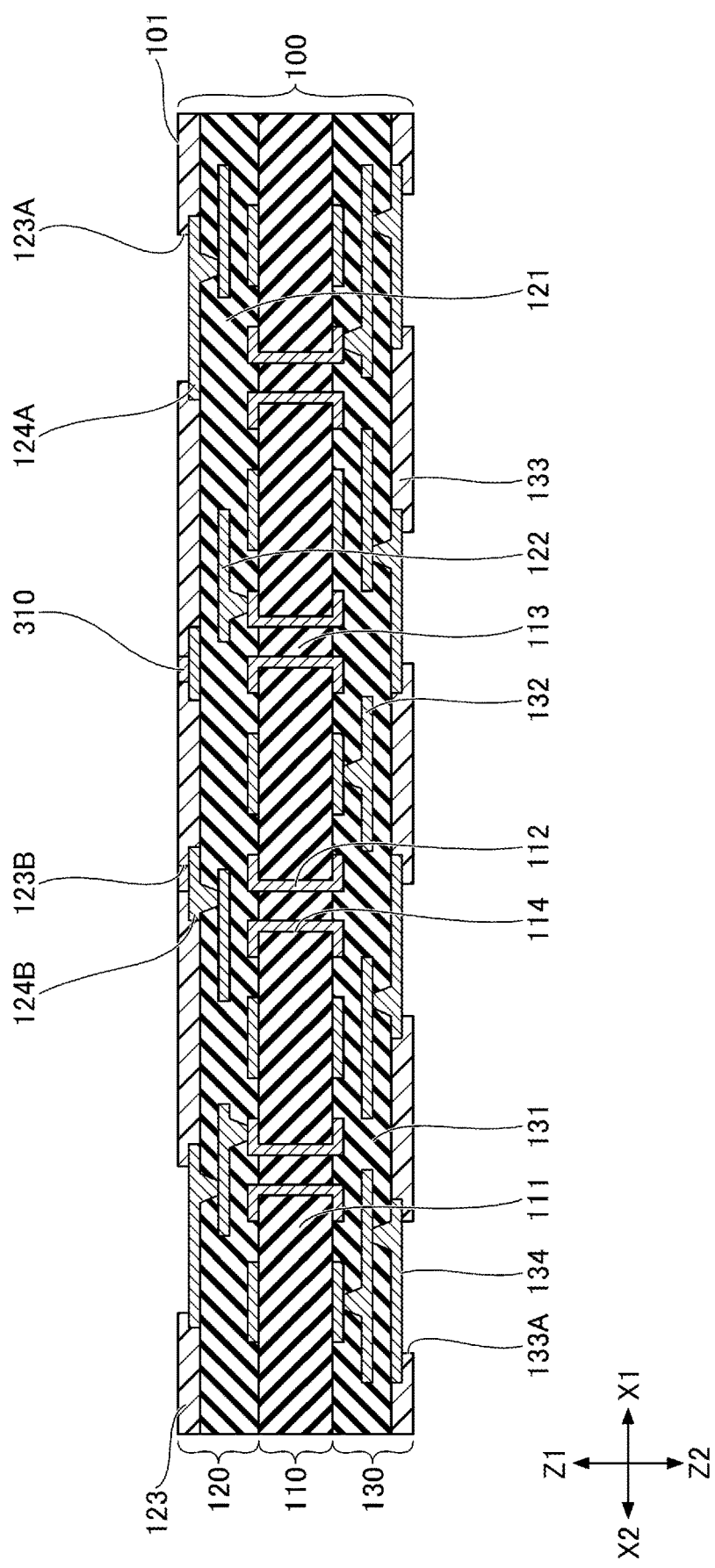
FIG. 3 is a cross-sectional view illustrating a method of making the semiconductor apparatus according to the embodiment.

As illustrated in FIG. 3, the lower substrate 100 is provided. As was previously described, the lower substrate 100 includes the conductive pads 124A, the conductive pads 124B, and the like. Subsequently, the bonding material 310, for example, is disposed on the conductive pads 124B. The bonding material 310 may be formed by electrolytic plating or the like.

Figure 4:
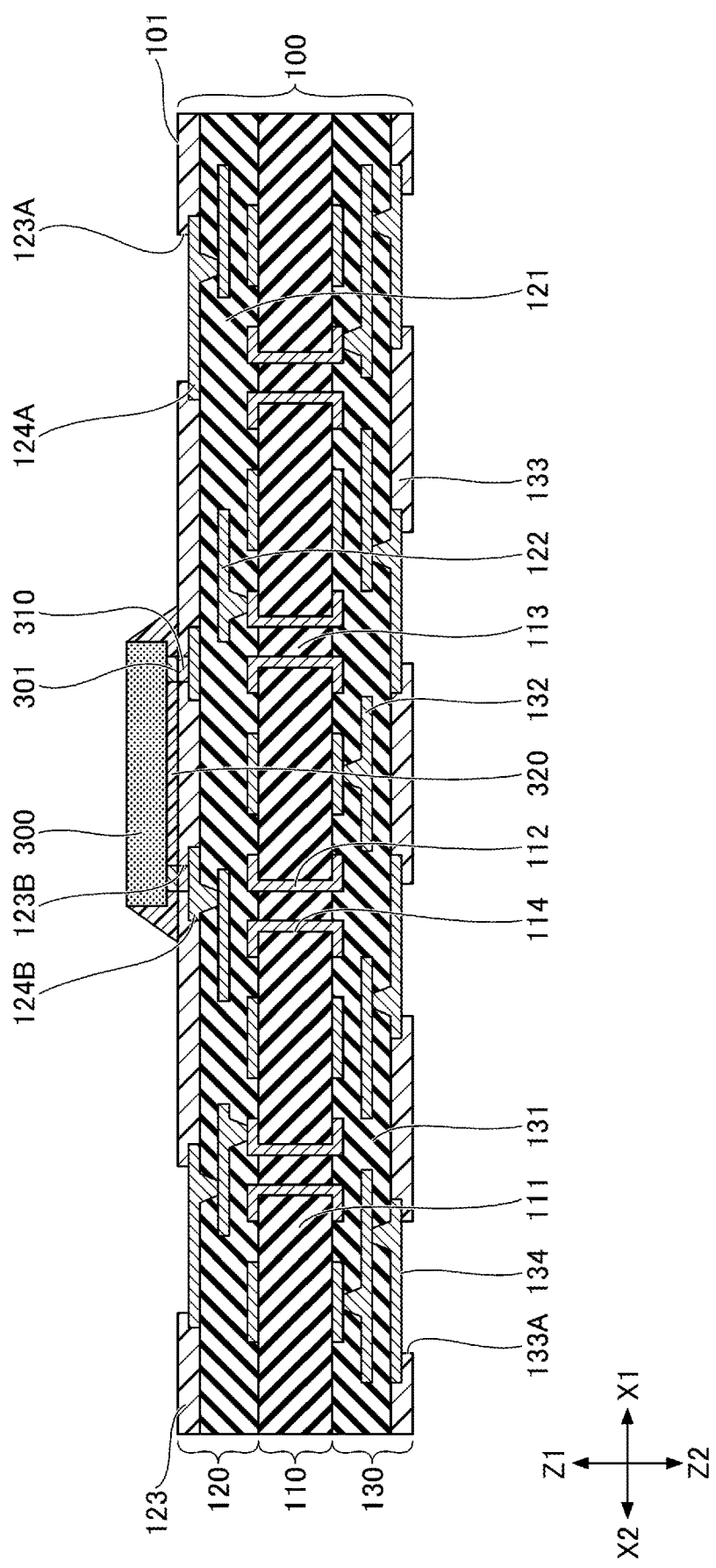
FIG. 4 is a cross-sectional view illustrating the method of making the semiconductor apparatus according to the embodiment.

As illustrated in FIG. 4, the semiconductor device 300 having bumps 301 formed thereon is flip-chip mounted on the lower substrate 100. In other words, the bumps 301 are electrically connected to the conductive pads 124B of the lower substrate 100 via the bonding material 310. Thereafter, the underfill material 320 fills the gap between the semiconductor device 300 and the lower substrate 100.

Figure 5:
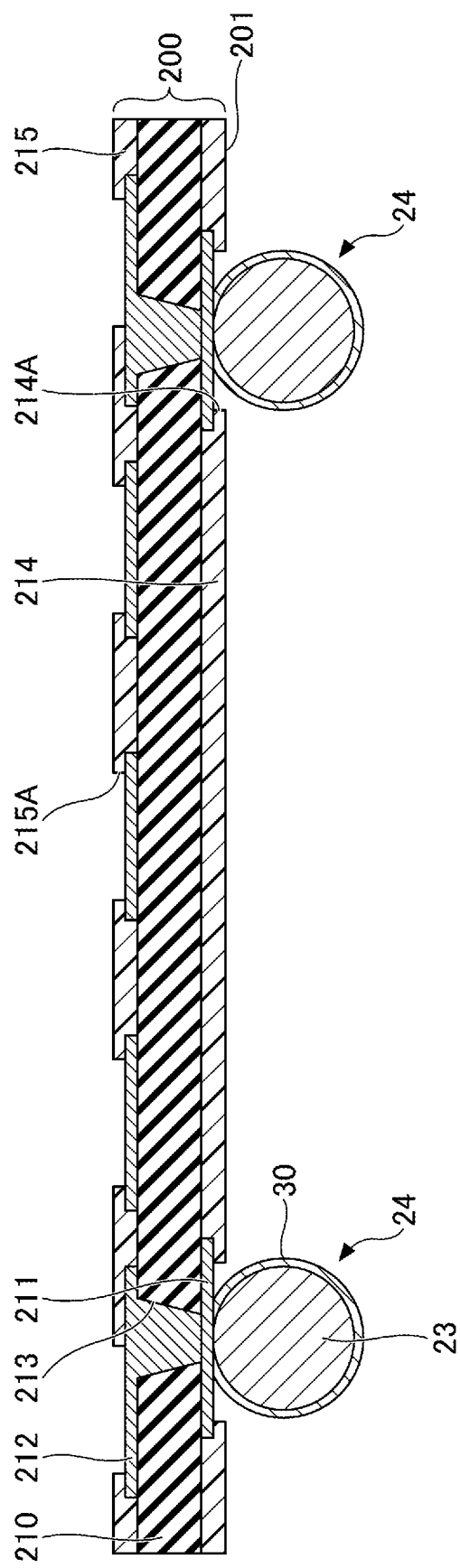
FIG. 5 is a cross-sectional view illustrating the method of making the semiconductor apparatus according to the embodiment.

As illustrated in FIG. 5, the upper substrate 200 is provided. As was previously described, the upper substrate 200 includes the conductive pads 211 and the like. Solder balls 24 each with a copper core are then placed on the conductive pads 211. Each of the solder balls 24 with a copper core has a spherical copper core ball 23 and a solder layer 30 disposed around the outer surface of the copper core ball 23. The term "spherical" in this disclosure does not refer to a mathematically defined perfect sphere. An Ni layer may be formed on the surface of the copper core balls 23.

Figure 6:
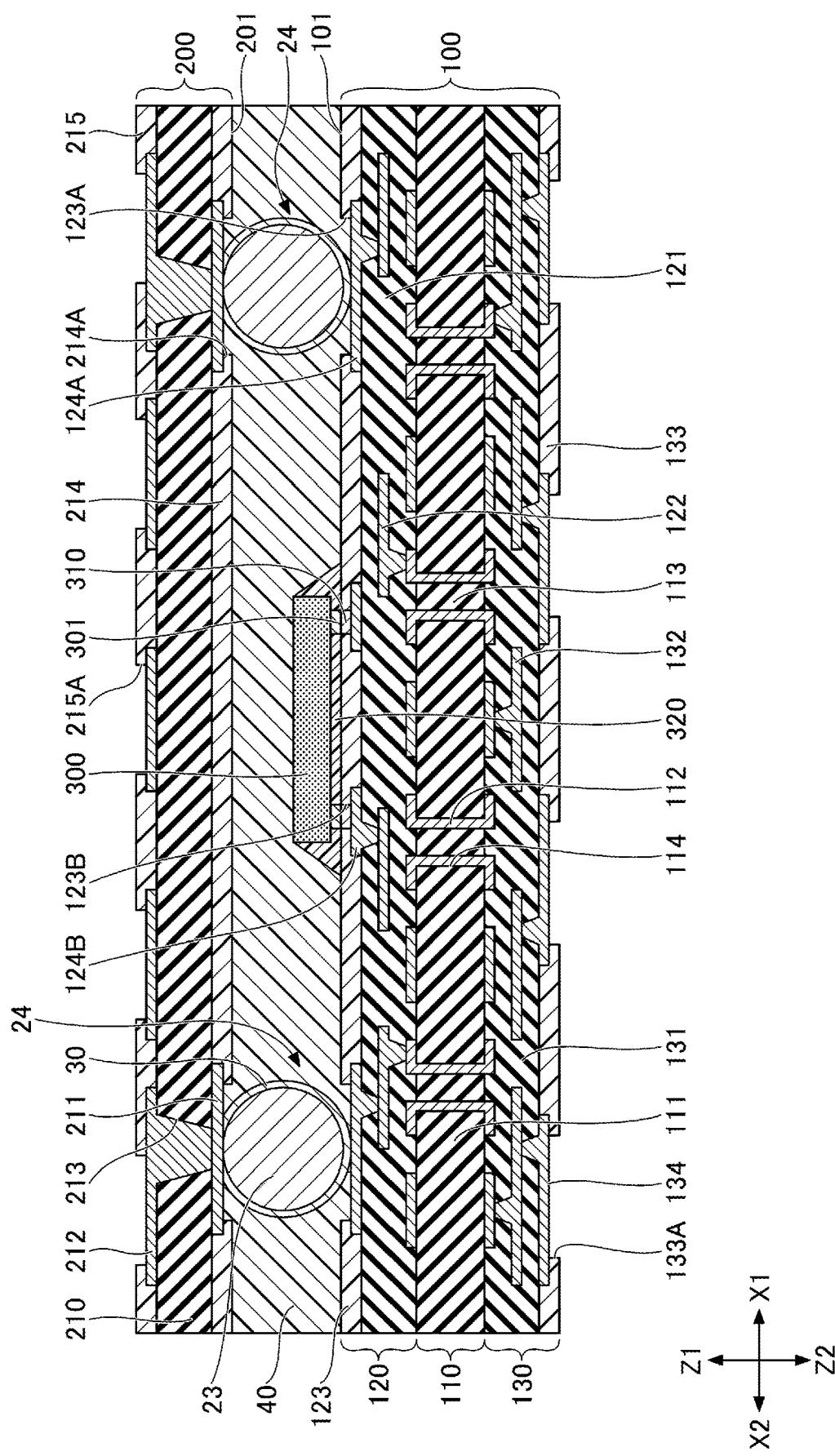
FIG. 6 is a cross-sectional view illustrating a method of making the semiconductor apparatus according to the embodiment.

After filling the gap between the semiconductor device 300 and the lower substrate 100 with the underfill material 320 and mounting the solder balls 24 each with a copper core, the upper substrate 200 is placed on the lower substrate 100 such that the solder balls 24 each with a copper core are brought in contact with the conductive pads 124A, while the mold resin 40 is provided between the lower substrate 100 and the upper substrate 200, as illustrated in FIG. 6. The semiconductor device 300 is disposed between the lower substrate 100 and the upper substrate 200.

Figure 7:
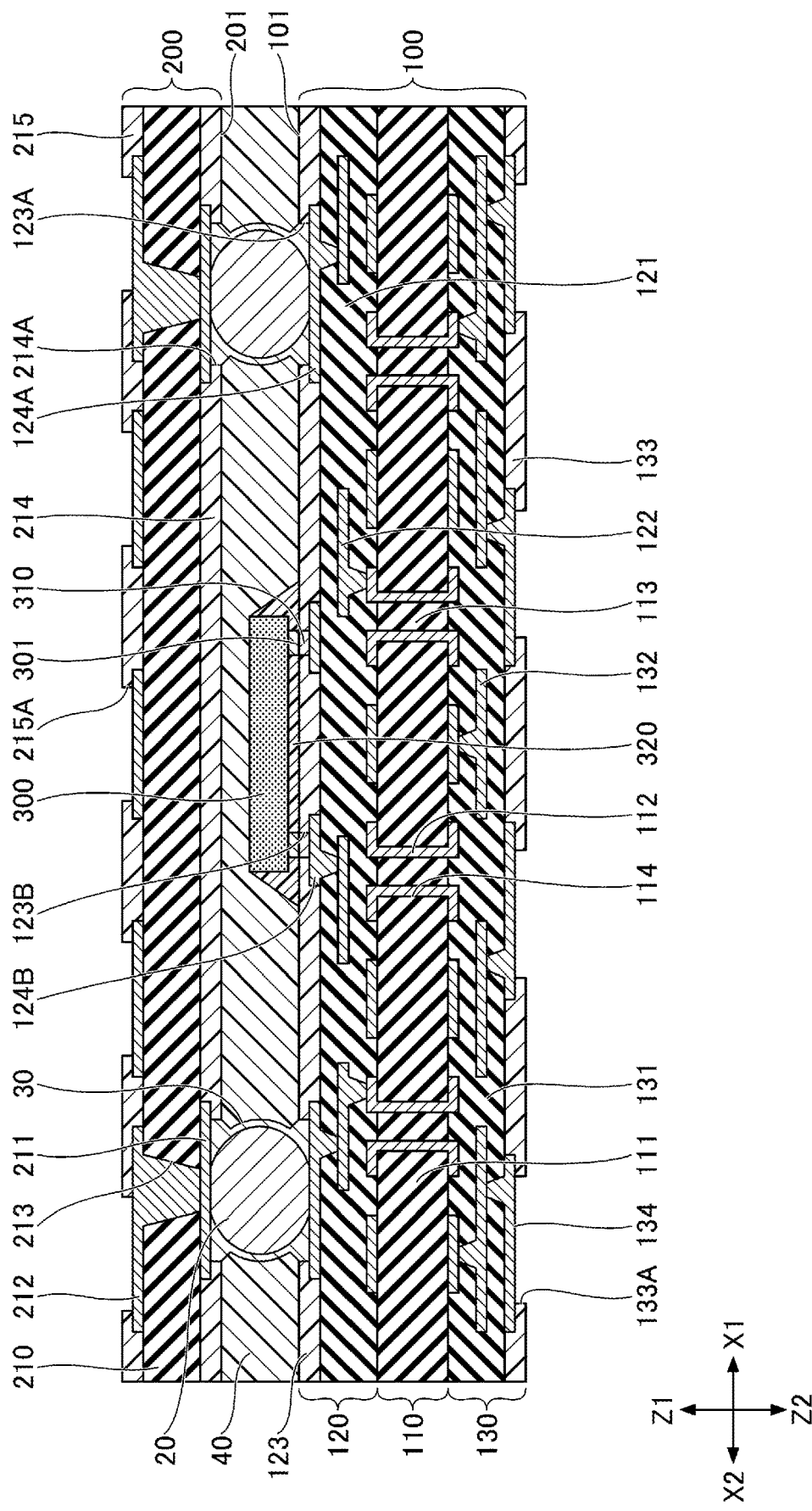
FIG. 7 is a cross-sectional view illustrating the method of making the semiconductor apparatus according to the embodiment.

Subsequently, the solder layer 30 is reflowed while compressing the laminate structure including the lower substrate 100 and the upper substrate 200 illustrated in FIG. 6 in the Z1-Z2 direction. Consequently, as illustrated in FIG. 7, the spherical copper core balls 23 are compressed in the Z1-Z2 direction to be turned into the ellipsoidal copper core balls 20. An alloy layer (not shown) is also formed from the components of the solder layer 30 (e.g., tin), the components of the conductive pads 124A (e.g., copper), and the components of the conductive pads 211 (e.g., copper). The temperature of reflow is about 260° C., for example.

Figure 8:
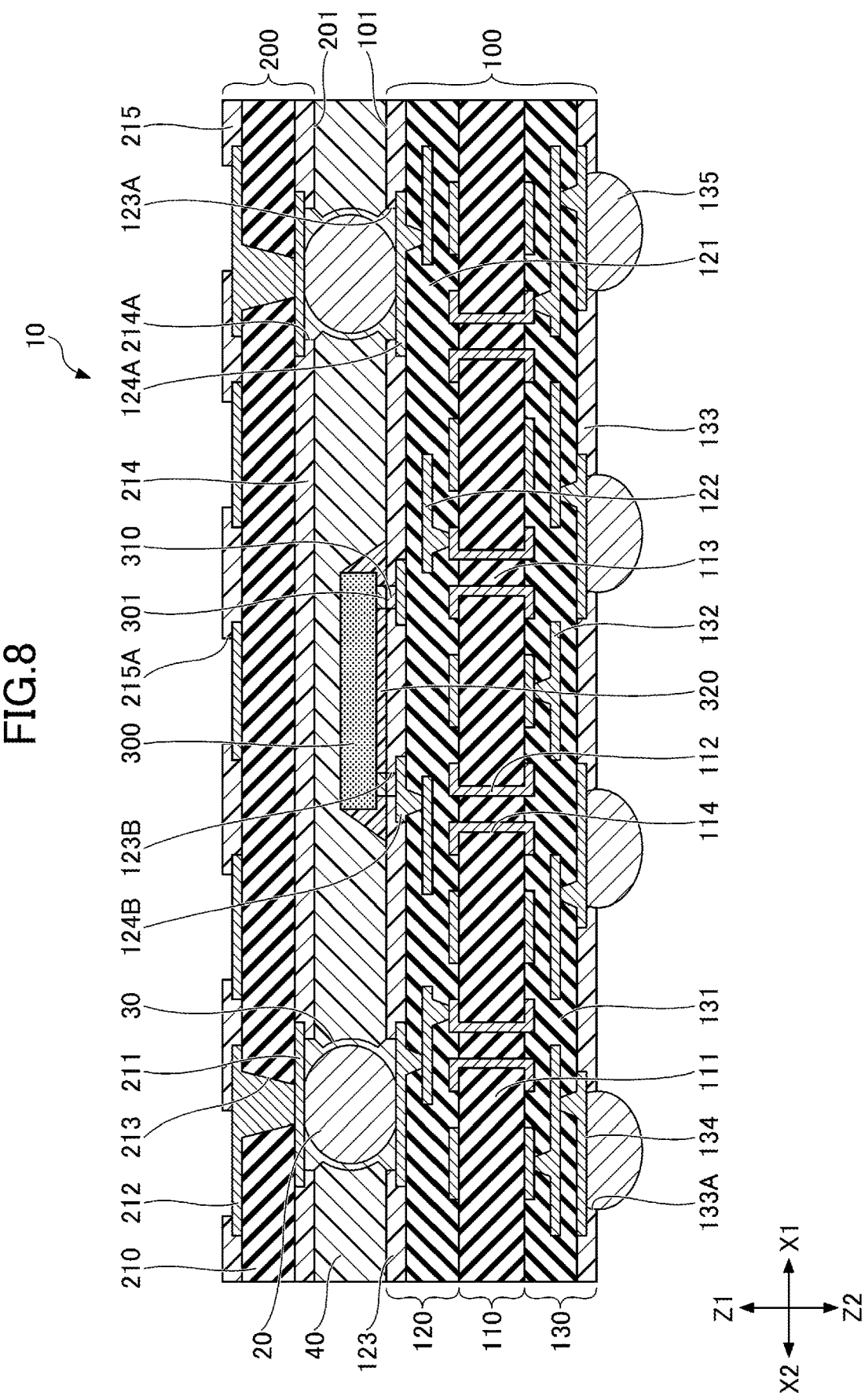
FIG. 8 is a cross-sectional view illustrating the method of making the semiconductor apparatus according to the embodiment.

As illustrated in FIG. 8, the solder balls 135 are formed on the conductive pads 134.

With this, the semiconductor apparatus 10 according to the embodiment is completed in final form.

The mold resin 40 may not be provided at the time of placing the upper substrate 200 on the lower substrate 100. The mold resin 40 may be provided after the ellipsoidal copper core balls 20 are formed. Instead of providing the mold resin 40 at the time of placing the upper substrate 200 on the lower substrate 100. the mold resin 40 may be provided at the time of compressing the laminate structure inclusive of the lower substrate 100 and the upper substrate 200, as illustrated in FIG. 6, in the Z1-Z2 direction.

Figure 9:
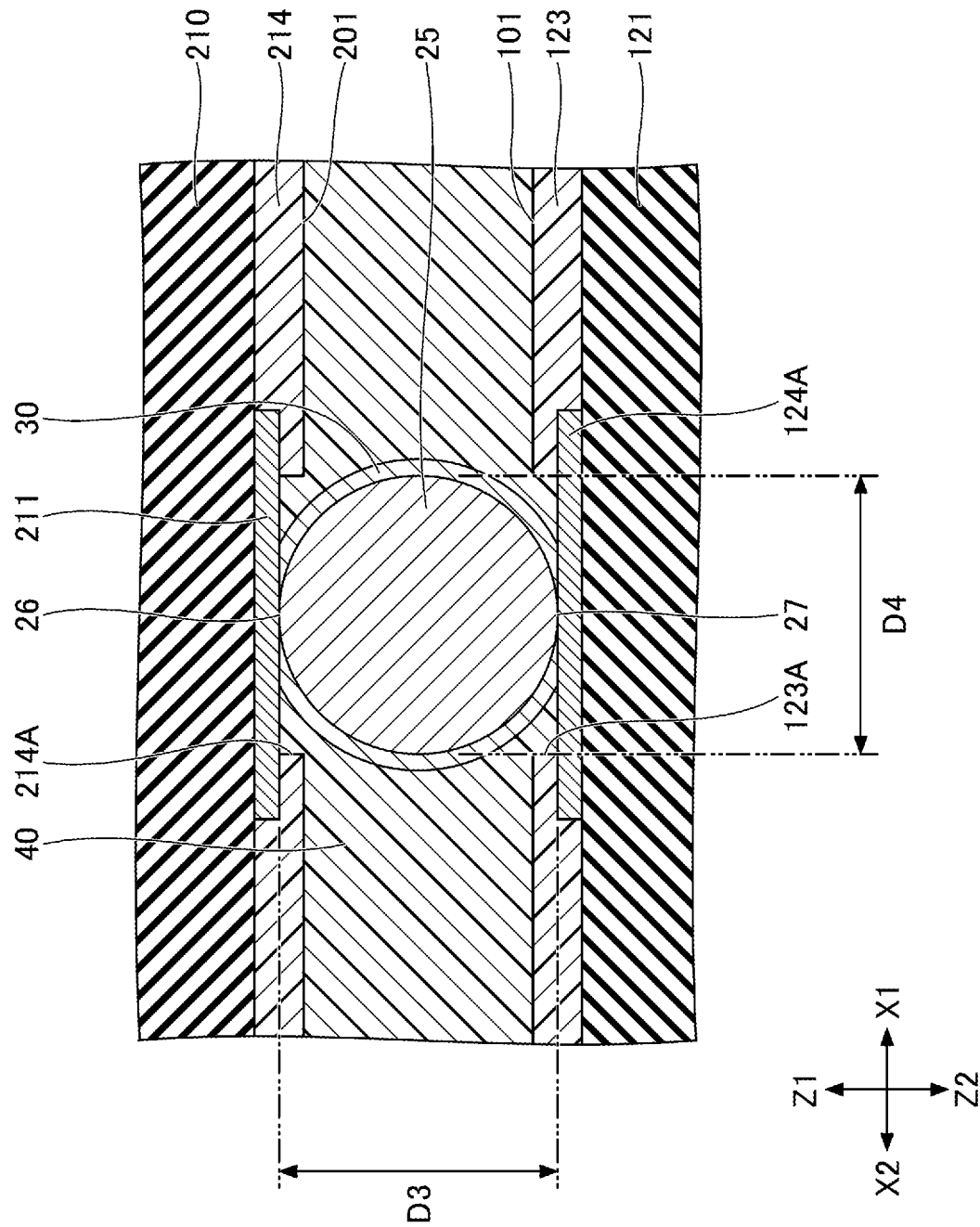
FIG. 9 is a cross-sectional view illustrating a copper core ball of a comparative example.

In the following, the effects of the present embodiment will be discussed with reference to a comparative example. FIG. 9 is a cross-sectional view illustrating a copper core ball of the comparative example.

In the comparative example illustrated in FIG. 9, a spherical copper core ball 25 is provided in place of the copper core ball 20. Since the copper core ball 25 is spherical, the maximum dimension D3 of the copper core ball 25 in the Z1-Z2 direction is equal to the maximum diameter. D4 of the copper core ball 25 in an XY plane. The copper core ball 25 has a first contact point 26 in contact with the conductive pad 124A and a second contact point 27 in contact with the conductive pad 211. The remaining configurations are substantially the same as the configurations of the present embodiment.

In the semiconductor apparatus 10 according to the present embodiment, the maximum dimension D1 of the copper core ball 20 in the Z1-Z2 direction is smaller than the maximum diameter D2 of the copper core ball 20 in an XY plane, and, also, the copper core ball 20 has the first contact surface 21 in contact with the conductive pad 124A and the second contact surface 22 in contact with the conductive pad 211.

In this manner, the copper core ball 25 of the comparative example is in contact with the conductive pad 124A and the conductive pad 211 at a point, whereas the copper core ball 20 of the present embodiment is in surface-to-surface contact with the conductive pad 124A and the conductive pad 211. With this arrangement, the present embodiment provides higher reliability for connection between the copper core ball 20 and the lower and upper substrates 100 and 200 than does the comparative example.

As was previously described, further, an alloy layer is formed during the reflow of the solder layer 30. The volume of the solder layer 30 is reduced as a result of the formation of the alloy layer, but the present embodiment ensures excellent connection reliability despite the reduction of the volume of the solder layer 30.

Also, in the present embodiment, during the process in which the spherical copper core ball 23 is compressed and turned into the elliptical copper core ball 20, the solder layer 30 spreads over the conductive pad 124A and over the conductive pad 211. Namely, a wide contact area is provided between the solder layer 30 and each of the conductive pad 124A and the conductive pad 211. Because of this, despite the decrease in the volume of the solder layer 30 as a result of the formation of the alloy layer, secure connection between the lower substrate 100 and the upper substrate 200 is maintained.

Further, the distance between the conductive pad 124A and the conductive pad 211 may vary due to warpage or the like of the lower substrate 100 and the upper substrate 200 prior to the reflow of the solder layer 30. In such a case, the comparative example configuration may fail to enable some of the copper core balls 25 to come in contact with the conductive pads 124A and the conductive pads 211. According to the present embodiment on the other hand, the copper core ball 23 is sandwiched between the conductive pad 124A and the conductive pad 211 so as to compress the copper core ball 23 to form the copper core ball 20, thereby enabling the copper core balls 20 to be securely in contact with the conductive pads 124A and the conductive pads 211. Further, in the case of the size of the copper core ball 23 and the size of the copper core ball 25 being the same, the present embodiment provides the semiconductor apparatus 10 with a shorter height (i.e., smaller dimension in the Z1-Z2 direction).

The conductive pad 124A and the conductive pad 211 may also be deformed during compression of the copper core ball 23. The copper core ball 20 may be caused to dig into the conductive pad 124A and the conductive pad 211. When the copper core ball 20 is caused to dig into the conductive pad 124A and the conductive pad 211, the first contact surface 21 and the second contact surface 22 are likely to become curved surfaces, which readily provides the first contact surface 21 and the second contact surface 22 with relatively large areas, compared with when the first contact surface 21 and the second contact surface 22 are flat surfaces.

Figure 10:
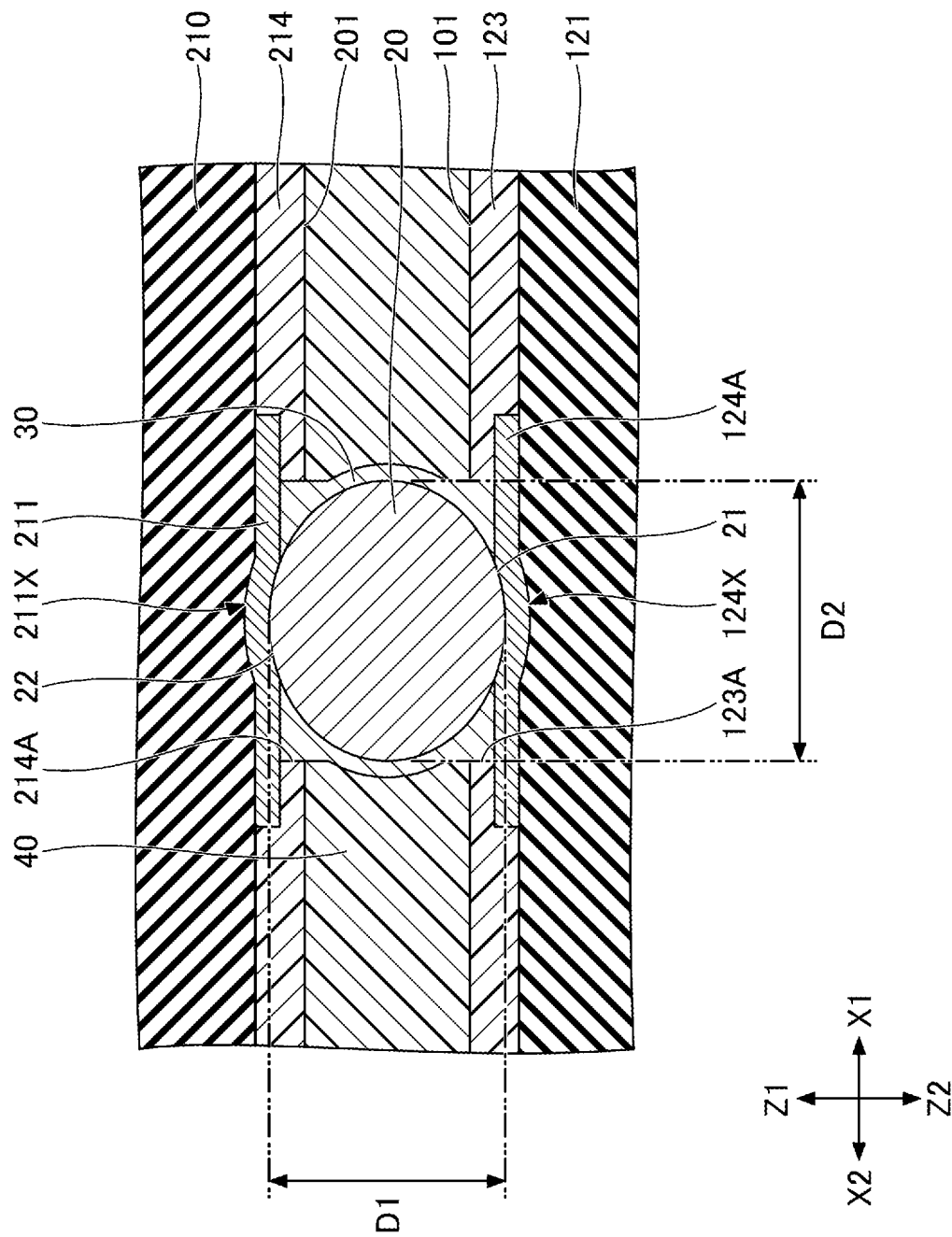
FIG. 10 is a cross-sectional view illustrating a copper core ball according to a variation of the embodiment.

For example, as illustrated in FIG. 10, the first contact surface 21 and the second contact surface 22 of the copper core ball 20 may be curved. The conductive pad 124A may have a first curved area 124X curved to conform to the shape of the first contact surface 21, and the conductive pad 211 may have a second curved area 211X curved to conform to the shape of the second contact surface 22. FIG. 10 is a cross-sectional view illustrating a copper core ball according to a variation of the embodiment.

The maximum dimension D1 is preferably from 80.0% to 99.9% and more preferably from 85.0% to 95.0% of the maximum diameter D2. The smaller the ratio of the maximum dimension D1 to the maximum diameter D2, the more likely the areas of the first contact surface 21 and the second contact surface 22 are greater. On the other hand, when the ratio of the maximum dimension D1 to the maximum diameter D2 becomes too small, it may become difficult to reduce the risk of short circuit between the copper core balls 20 while securing an appropriate distance between the lower substrate 100 and the upper substrate 200.

The first diameter of the first contact surface 21 and the second diameter of the second contact surface 22 are preferably 0.1% to 20.0% and more preferably 5.0% to 15.0% of the maximum diameter D2. The greater the ratio of the first and second diameters to the maximum diameter D2, the more likely the areas of the first contact surface 21 and the second contact surface 22 are greater. On the other hand, increasing the ratio of the first and second diameters to the maximum diameter D2 requires compressing the copper core ball 23 with an increased force, which may make machining more difficult. When at least one of the first diameter of the first contact surface 21 and the second diameter of the second contact surface 22 is within the preferable range noted above, improved connection reliability is readily provided. When at least one of these diameters is within the more preferable range noted above, further improved connection reliability is readily provided.

The material of the core layers 110 and 210 is not limited to a material containing a reinforcement such as glass epoxy, and may be made of a material that contains no reinforcement.

The upper substrate 200 may be replaced with an alternative member. In place of a resin substrate such as the upper substrate 200, an interconnect layer 250 made of a thick metal plate such as a lead frame may be provided as illustrated in FIG. 11. The side surface of the interconnect layer 250 may be covered with the mold resin 40, or may be exposed above the mold resin 40. In such a case, a plain metal plate may be bonded to the lower substrate 100 via the copper core balls 20, and, then, the mold resin 40 may be provided to fill the gap between the metal plate and the lower substrate 100, followed by etching the metal plate to form the interconnect layer 250.

Although a description has been given with respect to preferred embodiments and the like, the present invention is not limited to these embodiments and the like, but various variations and modifications may be made to these embodiments and the like without departing from the scope of the present invention.

According to at least one embodiment, connection reliability is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clause.

[Clause 1] A method of making a semiconductor apparatus, comprising:
   mounting a semiconductor device on a first major surface of a first substrate, the first substrate having a first conductive pad on the first major surface;
   placing a spherical conductive core ball on a second conductive pad of a second substrate, the second substrate having a second major surface and having the second conductive pad on the second major surface; and
   causing the second major surface to oppose the first major surface, and bonding the conductive core ball to the first conductive pad and to the second conductive pad,
   wherein the bonding the conductive core ball to the first conductive pad and to the second conductive pad includes
   compressing the conductive core ball in a first direction perpendicular to the first major surface to cause a maximum dimension of the conductive core ball in the first direction to be smaller than a maximum diameter of the conductive core ball in a plane parallel to the first major surface.

What is claimed is:

1. A semiconductor apparatus, comprising:
   a first substrate having a first surface and a first conductive pad on the first surface;
   a first solder resist layer disposed on the first surface and having a first opening within which a portion of the first conductive pad is positioned;
   a second substrate having a second surface opposing the first surface, and having a second conductive pad on the second surface;
   a second solder resist layer disposed on the second surface and having a second opening within which a portion of the second conductive pad is positioned;
   a semiconductor device disposed between the first substrate and the second substrate and mounted on the first surface of the first substrate;
   a conductive core ball made of copper in contact with the first conductive pad and the second conductive pad; and
   a solder layer covering at least a side surface of the conductive core ball, a portion of the solder layer being located inside the first opening to cover the portion of the first conductive pad, another portion of the solder layer being located inside the second opening to cover the portion of the second conductive pad, wherein a maximum dimension of the conductive core ball in a first direction perpendicular to the first surface is smaller than a maximum diameter of the conductive core ball in a plane parallel to the first surface, wherein the conductive core ball includes:

a first contact surface in direct contact with the first conductive pad; and a second contact surface in direct contact with the second conductive pad, and wherein the first contact surface and the second contact surface are each three-dimensionally curved, and a first diameter of the first contact surface and a second diameter of the second contact surface are 5.0% to 15.0% of the maximum diameter of the conductive core ball.

2. The semiconductor apparatus as claimed in claim 1, wherein a shape of the conductive core ball is ellipsoidal.

3. The semiconductor apparatus as claimed in claim 1, wherein the first conductive pad includes a first curved area curved to conform to a shape of the first contact surface of the conductive core ball.

4. The semiconductor apparatus as claimed in claim 1, wherein the second conductive pad includes a second curved area curved to conform to a shape of the second contact surface of the conductive core ball.

5. The semiconductor apparatus as claimed in claim 1, wherein an alloy layer is formed at an interface between the solder layer and each of the first conductive pad and the second conductive pad, the alloy layer being formed from a component of the solder layer and a component of the first conductive pad or the second conductive pad.

6. The semiconductor apparatus as claimed in claim 1, wherein the maximum dimension is 85.0% to 95.0% of the maximum diameter.

* * * * *